(12) United States Patent
Haapala

(10) Patent No.: US 6,345,178 B1
(45) Date of Patent: Feb. 5, 2002

(54) LINEAR BALANCED RF MIXER

(75) Inventor: Miika Haapala, Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/617,461

(22) Filed: Jul. 17, 2000

(51) Int. Cl.$^7$ ................................. H04B 1/28
(52) U.S. Cl. ................ 455/326; 455/333; 327/113
(58) Field of Search .................. 455/91, 118, 119, 455/323, 325, 326, 333, 313, 318–319, 293; 327/113, 357, 359

(56) References Cited

U.S. PATENT DOCUMENTS

| | | | |
|---|---|---|---|
| 4,344,188 A | * 8/1982 | Tanabe et al. | 455/326 |
| 5,379,457 A | 1/1995 | Nguyen | 455/323 |
| 5,826,182 A | 10/1998 | Gilbert | 455/326 |
| 5,859,559 A | * 1/1999 | Hong et al. | 327/359 |
| 5,886,916 A | 3/1999 | Muraoka | |
| 6,026,286 A | 2/2000 | Long | 455/327 |

FOREIGN PATENT DOCUMENTS

EP          0 711 031 A1     5/1996

* cited by examiner

*Primary Examiner*—Doris H. To
(74) *Attorney, Agent, or Firm*—Cohen, Pontani, Lieberman & Pavane

(57) ABSTRACT

The present invention relates to an up conversion RF mixer having first differential transistor pair comprising first and second transistors and a second differential transistor pair having third and fourth transistors. The emitters of the first and second transistors are connected to the drain of a fifth transistor and the emitters of the third and fourth transistors are connected to the drain of a sixth transistor. The sources of the fifth and sixth transistors are connected to drains of seventh and eighth transistors, respectively. A local oscillator signal is connected to the bases of the first and second transistors and to the bases of the third and fourth transistors. A first intermediate frequency signal is connected to the gate of the fifth transistor and the gate of the eighth transistor. A second intermediate frequency signal which is the inverse of the first intermediate frequency signal is connected to the gates of the sixth and seventh transistors. The gates of fifth and sixth transistores are also connected to a constant bias voltage and the gates of the seventh and eighth transistors are connected to a bias current circuit.

12 Claims, 2 Drawing Sheets

LINEAR BALANCED RF MIXER

BACKGROUND OF THE INVENTION

1. Field of the Invention

The present invention relates to a Radio Frequency (RF) Mixer.

2. Description of the Related Art

Radio Frequency (RF) Mixers, also referred to as modulators, are used to up convert an IF input signal having an intermediate frequency to a desired output signal having an radio frequency (IF). These devices combine the IF input signal with a local oscillator (LO) signal at an LO frequency to produce an output signal with an RF equal to the sum or the difference of the LO and IF frequencies (LO+IF or LO−IF). Since this is an up conversion, the sum is the desired signal. Instead of up-converting, the RF mixer may also be used to down-convert a baseband analog. To down convert a signal, the RF signal is used as an input and the output comprises the IF signal.

FIG. 1 shows a known double-ended RF mixer (Gilbert cell) 10 for up conversion of an IF input signal including a first differential pair of transistors 20 including a first transistor Q1' and a second transistor Q2' and a second differential pair of transistors 22 including a third transistor Q3' and a fourth transistor Q4'. Each of the first through the fourth transistors Q1'–Q4' includes a base, a collector, and an emitter. A local oscillator (LO) is connected across the bases of the first differential pair of transistors 20 and the bases of the second differential pair of transistors 22. The emitters of the first differential transistor pair 20 are connected to the collector of a fifth transistor Q5' and the emitters of the second differential transistor pair 22 are connected to the collector of a sixth transistor Q6'. The fifth and sixth transistors Q5', Q6' each have a base, a collector, and an emitter. A first current supply I1 is connected between the emitter of the fifth transistor Q5' and an electrical ground and a second current supply I2 is connected between the emitter of the sixth transistor Q6' and the electrical ground. The emitters of the fifth and sixth transmitters Q5', Q6' are connected to one another through an emitter degeneration resistor $R_D$. The base of the fifth transistor Q5' is connected to a first intermediate frequency signal terminal IF+ and the base of the sixth transistor Q6' is connected to a second intermediate frequency terminal IF−. The first and second differential pair of transistors are cross coupled at their collectors to first and second radio frequency signal terminals RF+, RF−.

In the absence of an IF signal at IF+, IF−, the oscillations of the local oscillator causes the quiescent current of the first current supply I1 to commutate between the first and second transistors Q1' and Q2' and the quiescent current of the second current supply I2 to commutate between the third and fourth transistors Q3' and Q4'. As IF+ and IF− change, the current through the fifth and sixth transistors Q5' and Q6' is modulated. The output at the RF terminals comprises either a sum or a difference of the oscillator frequency and the IF frequency. However, the relationship between $I_{IF+}$ and $I_{Q5}$ and the relationship between $I_{IF-}$ and $I_{Q6}$ are non-linear. To improve linearity, high biasing currents are used. Furthermore, the emitter degeneration resistor $R_D$ connected between the emitters of the fifth and sixth transistors Q5' and Q6' is given a large value. These measures require large current consumption.

SUMMARY OF THE INVENTION

The present invention provides an RF mixer having linear characteristics and low power consumption.

According to an embodiment of the present invention, an RF mixer comprises a first differential transistor pair including first and second transistors and a second differential transistor pair including third and fourth transistors. Each of the first though fourth transistors has a base, a collector, and an emitter. The RF mixer includes a first stage input frequency differential transistor pair including fifth and sixth transistors. Each of the fifth and sixth transistors has a gate, a drain, and a source. The drain of the fifth transistor is connected to the emitters of the first and second transistors and the drain of the sixth transistor is connected to the emitters of the third and fourth transistors. The RF mixer further includes a second stage input frequency differential transistor pair including seventh and eighth transistors, each having a gate, a drain, and a source. The drain of the seventh transistor is connected to the source of the fifth transistor and the drain of the eighth transistor is connected to the source of the sixth transistor. A bias voltage circuit is connected to the gate of the fifth transistor and the gate of the sixth transistor. A bias current circuit is connected to the gate of the seventh transistor and connected to the gate of the eighth transistor. A local oscillator is connected between the bases of the first and second transistors and between the bases of the third and fourth transistors. An input frequency input may be connected between the gates of the first stage input frequency differential transistor pair and an inverted input frequency input may be connected between the gates of the second stage radio frequency differential transistor pair.

The voltage bias circuit comprises a constant voltage source connected to the gate of the fifth transistor via a first resistor and the gate of the sixth transistor via a second resistor. The current bias circuit comprises a constant current source connected to the gate of the seventh transistor via a third resistor and connected to the gate of the eighth transistor via a fourth transistor. The current bias circuit further comprises a ninth transistor having a gate, a drain and a source. The ninth transistor is operatively connected to the constant current source so that the constant current output from said constant current source is divided into four paths. The first path includes the junction between the drain of the ninth transistor and the source of the ninth transistor, the second path includes the junction between the gate of the ninth transistor and the source of the ninth transistor, the third path includes the third resistor and the junction between the gate of the seventh transistor and the source of the seventh transistor, and the fourth path includes the fourth resistor and the junction between the gate of the eighth transistor and the source of the eighth transistor.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
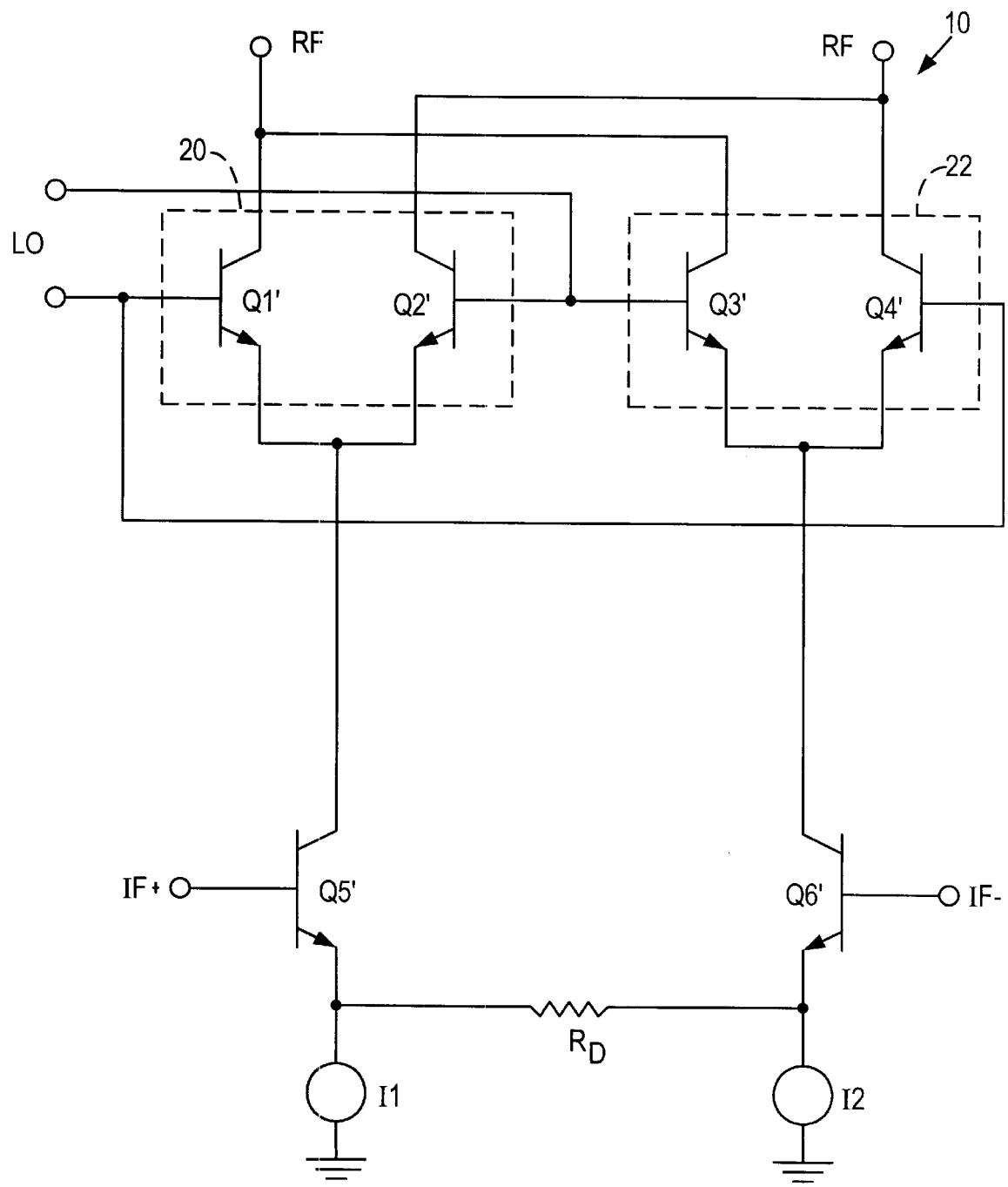
FIG. 1 is a schematic diagram showing the conventional double-ended Gilbert cell.
Figure 2:
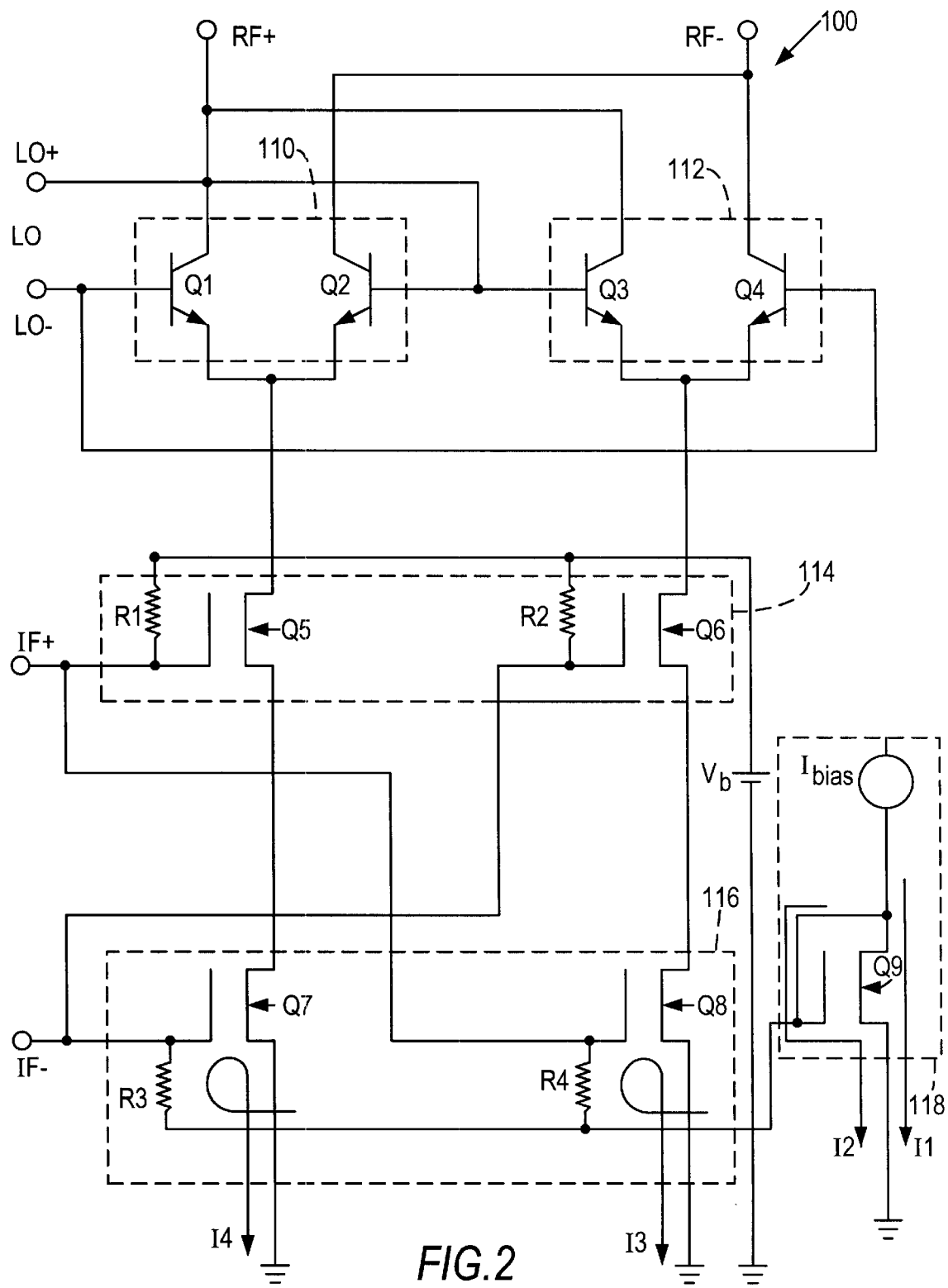
FIG. 2 is a schematic diagram showing an RF mixer according to an embodiment of the present invention.

FIG. 2 shows an RF mixer 100 according to an embodiment of the present invention. The RF mixer 100 is used in a base station in a mobile communication system to up-convert a baseband signal for case of transmission. In particular, the RF mixer 100 may be used as the second up-conversion mixer in a transmitter chain in a base station where linearity requirements are high.

The RF mixer 100 includes a first differential transistor pair 110 including a first transistor Q1 and a second transistor Q2 and a second differential transistor pair 112 including a third transistor Q3 and a fourth transistor Q4. Each of the first through fourth transistors comprises a bipolar junction transistor having a base, a collector, and an emitter. The RF mixer 100 includes first and second local oscillator (LO) terminals LO+ and LO−. The first LO terminal LO+ is connected to the base of the second transistor Q2 of the first differential transistor pair 110 and the base of the third transistor Q3 of the second differential transistor pair 112. The second LO terminal LO− is connected to the base of the first transistor Q1 of the first differential transistor pair 110 and the base of the fourth transistor Q4 of the second differential transistor pair 112. The collectors of the first and second transistors Q1, Q2 of the first differential transistor pair 110 are connected to radio frequency output terminals RF+, RF−. The collectors of the third and fourth transistors Q3, Q4 of the second differential transistor pair 112 are also connected to the output terminals RF+, RF−.

The RF mixer 100 further comprises a first stage intermediate frequency differential transistor pair 114 including a fifth transistor Q5 and a sixth transistor Q6 and a second intermediate frequency differential transistor pair 116 including a seventh transistor Q7 and an eighth transistor Q8. Each of the fifth through the eighth transistors Q5–Q8 comprises a field effect transistor having a gate, a drain, and a source. The emitters of the first and second transistors Q1, Q2 are connected to the drain of the fifth transistor Q5, and the source of the fifth transistor Q5 is connected to the drain of the seventh transistor Q7. The source of the seventh transistor Q7 is connected to an electrical ground. The emitters of the third and fourth transistors Q3, Q4 are connected to the drain of the sixth transistor Q6, and the source of sixth transistor Q6 is connected to the drain of the eighth transistor Q8. The source of the eighth transistor Q8 is also connected to the electrical ground.

Accordingly, the current output from each differential transistor pair 110, 112 is conducted through the DS junctions of two stages of transistors that are connected in series.

A first resistor R1 is connected between the gate terminal of the fifth transistor Q5 and a constant (bias) voltage supply $V_b$. Similarly, a second resistor R2 is connected between the gate terminal of the sixth transistor Q6 and the constant bias voltage $V_b$. The first and second intermediate input terminals IF+, IF− of a intermediate frequency input signal are connected to the gates of the fifth and sixth transistors Q5, Q6 of the first stage intermediate frequency differential transistor pair 114, respectively. A third resistor R3 is connected between the gate of the seventh transistor Q7 and a bias current circuit 118 including a constant current supply $I_{bias}$. A fourth resistor R4 is connected between the gate of the eighth transistor Q8 and the bias current circuit 118. Therefore, the quiescent current of a constant current source is connected to the input side of each of the second stage transistors.

The bias current circuit 118 also includes a ninth transistor Q9 comprising a field effect transistor having a gate, a drain, and a source. The ninth transistor Q9 is connected to the current supply $I_{bias}$ and the electrical ground so that the bias current from the current supply $I_{bias}$ is divided between four paths comprising: (1) a first path I1 including the DS junction of a transistor Q9, (2) a second path I2 including the GS junction of transistor Q9, (3) a third path I3 including the resistor R3 and the GS junction of transistor Q7 and (4) a fourth path I4 comprising the resistor R4 and the GS junction of transistor Q8.

The first intermediate frequency input terminal IF+ of an intermediate frequency input signal is connected to the gate of the eighth transistor Q8 and a second intermediate frequency input terminal IF− of a radio frequency input signal is connected to the gate of the seventh transistor Q7 of the second stage radio frequency differential transistor pair 116. The connection of the first and second intermediate frequency inputs IF+ and IF− to the sixth and eighth transistors Q6 and Q8 is the inverse of the connection of the second and first intermediate frequency inputs IF−, IF+ to the fifth and seventh transistors Q5 and Q7. The sixth and eighth transistors Q6 and Q8 are connected so that the gate of eighth transistor Q8 is connected to the first intermediate frequency input IF+ and the gate of the sixth transistor Q6 is connected to the second intermediate frequency input IF−.

When no IF input signal is being input to the first and second intermediate frequency input terminals IF+, IF−, the local oscillator causes a current through the first differential transistor pair 110 to commutate between the first and second transistors Q1 and Q2 at the LO frequency and a current through the second differential transistor pair 112 to commutate between the third and fourth transistors Q3, Q4 at the LO frequency. The current supply $I_{bias}$ and bias voltage $V_b$ determine the amount of current.

When the IF signal is input to the first and second intermediate frequency input terminals IF+ and IF−, a decrease in voltage at the second intermediate frequency input terminal IF− produces a decrease in the current through the GS junction of the seventh transistor Q7. The decrease in the current through GS junction of the seventh transistor Q7 decreases the current conducted through the DS junction of the seventh transistor Q7. Since the DS junction of the seventh transistor Q7 is connected in series with the DS junction of the fifth transistor Q5, the current through the fifth transistor Q5 is also limited by the current through the seventh transistor Q7. The first intermediate frequency input terminal IF+ is the inverse of the second intermediate frequency input terminal IF−. Accordingly, when the voltage at the second intermediate frequency input terminal IF− decreases, the voltage at the first intermediate frequency input terminal IF+ increases. The intermediate frequency input terminal IF+ is connected to the first resistor R1 and the gate of the fifth transistor Q5. The other end of the first resistor R1 is connected to a constant bias voltage $V_b$. Therefore, the voltage across the first resistor R1 is $V_b - V_{IF+}$. As the $V_{IF+}$ increases, the current through the first resistor R1 and the current through the GS junction of the fifth transistor Q5 decreases. Accordingly, when $V_{IF+}$ is positive and $V_{IF-}$ is negative, the current through the fifth and seventh transistors Q5 and Q7, which is connected to the first differential transistor pair 110 decreases and the current through the sixth and eighth transistors Q6 and Q8, which are connected to the second differential transistor pair 112, increases. As the first and second intermediate frequency input signals IF+ and IF− change, the current through the fifth and seventh transistors Q5 and Q7 and the current through the sixth and eighth transistors Q6 and Q8 modulates.

The modulation between the current through the fifth and seventh transistors Q5, Q7 and the current through the sixth and eighth transistors Q6, Q8 produces an output at the output terminals RF+ and RF− at a radio frequency equal to the sum and the difference between the LO frequency and the IF input frequency. Since the mixer in FIG. 2 is an up conversion mixer, the sum in the wanted signal.

The arrangement according to the present invention improves even-order non-linearities compared to the known Gilbert cell, thereby increasing the dynamic range. The inventions comprises two stages of transistors connected to the outputs of each of the first and second differential transistor pairs.

The above-described RF mixer is used for up conversion of an intermediate frequency input signal to a radio frequency output signal. Of course, this structure could also be used for down-conversion by connecting the input terminals to the radio frequency signals and having the output terminals outputting the intermediate frequency signals.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

For example, although N-channel FETs and NPN junction transistors are shown, it is understood that P-channel FETs may be substituted for the N-channel FETs and that PNP junction transistors may be substituted for NPN junction transistors with a corresponding change in polarity of the voltage supplies. Further, it is understood that PNP junction transistors can be used in place of the shown NPN junction transistors with the suitable reconfiguration of the transistors. It is also understood that scaling the size of a particular FET may be accomplished by simply enlarging the width of the FET or by paralleling multiple FETs to achieve the desired size. Additionally, more than one element may be used where only a single element is shown. For example, each resistor R1–R4 may comprise more than one resistive element.

I claim:

1. An RF mixer, comprising:
    a first local oscillator differential transistor pair including first and second transistors and means for connecting a local oscillator as an input to said first local oscillator differential transistor pair;
    a second local oscillator differential transistor pair including third and fourth transistors and means for connecting a local oscillator as an input to said second local oscillator differential transistor pair;
    a first stage input frequency differential transistor pair including fifth and sixth transistors, said fifth transistor coupled to said first and second transistors and said sixth transistor coupled to said third and fourth transistors;
    a second stage input frequency differential transistor pair including seventh and eighth transistors, said seventh transistor coupled to said fifth transistor and said eighth transistor coupled to said sixth transistor;
    a bias voltage circuit connected to said first stage input frequency transistor pair;
    a bias current circuit connected to said second stage input frequency differential transistor pair; and
    means for connecting an input frequency signal to said first stage input frequency differential transistor pair and connecting an inverted input frequency signal to said second stage input frequency differential transistor pair.

2. The RF mixer of claim 1, wherein each of said first, second third and fourth transistors comprises a bipolar junction transistor having a base, collector and emitter, and said emitters of said first and second transistors are connected to said fifth transistor and said emitters of said third and fourth transistors are connected to said sixth transistor.

3. The RF mixer of claim 2, wherein each of said fifth, sixth, seventh, and eighth transistors comprises a field effect transistor having a gate, a drain and a source, wherein said drain of said fifth transistor is connected to said emitters of said first and second transistors and said drain of said sixth transistor is connected to said emitters of said third and fourth transistors.

4. The RF mixer of claim 3, wherein said means for connecting said local oscillator to said first differential transistor pair comprises means for connecting said local oscillator to said bases of said first and second transistors and said means for connecting said local oscillator to said second differential transistor pair comprises means for connecting said local oscillator to said bases of said third and fourth transistors.

5. The RF mixer of claim 3, wherein said means for connecting an input frequency signal to said first stage input frequency differential transistor pair comprises means for connecting the input frequency signal to said gates of said fifth and sixth transistors and said means for connecting an inverted input frequency signal to said second stage input frequency differential transistor pair comprises means for connecting the inverted input frequency signal to said gates of said seventh and eighth transistors.

6. The RF mixer of claim 3, wherein said voltage bias circuit comprises a constant voltage source connected to said gate of said fifth transistor via a first resistor and said gate of said sixth transistor via a second resistor.

7. The RF mixer of claim 3, wherein said current bias circuit comprises a constant current source connected to said gate of said seventh transistor via a third resistor and connected to said gate of said eighth transistor via a fourth transistor.

8. The RF mixer of claim 7, wherein said current bias circuit further comprises a ninth transistor having a gate, a drain and a source, wherein said ninth transistor is operatively connected to said constant current source such that the constant current output from said constant current source is divided into a first, second, third and fourth paths, said first path comprising the junction between said drain of said ninth transistor and said source of said ninth transistor, said second path comprising the junction between said gate of said ninth transistor and said source of said ninth transistor, said third path comprising said third resistor and the junction between said gate of said seventh transistor and said source of said seventh transistor, and said fourth path comprising said fourth resistor and the junction between said gate of said eighth transistor and said source of said eighth transistor.

9. The RF mixer of claim 8, wherein said fifth through ninth transistors comprise n-channel field effect transistors.

10. The RF mixer of claim 9, wherein said first through fourth transistors comprise NPN bipolar junction transistors.

11. The RF mixer of claim 1, wherein said fifth through eighth transistors comprise n-channel field effect transistors.

12. The RF mixer of claim 11, wherein said first through fourth transistors comprise NPN bipolar junction transistors.

* * * * *